United States Patent
Kawada

(10) Patent No.: US 8,183,747 B2
(45) Date of Patent: May 22, 2012

(54) PIEZOELECTRIC PORCELAIN COMPOSITION, AND PIEZOELECTRIC CERAMIC ELECTRONIC COMPONENT

(75) Inventor: Shinichiro Kawada, Hikone (JP)

(73) Assignee: Murata Manufacturing Co., Ltd., Nagaokakyo-Shi, Kyoto-fu (JP)

( * ) Notice: Subject to any disclaimer, the term of this patent is extended or adjusted under 35 U.S.C. 154(b) by 0 days.

(21) Appl. No.: 12/634,420

(22) Filed: Dec. 9, 2009

(65) Prior Publication Data

US 2010/0102679 A1    Apr. 29, 2010

Related U.S. Application Data

(63) Continuation of application No. PCT/JP2008/056587, filed on Apr. 2, 2008.

(30) Foreign Application Priority Data

Jun. 15, 2007  (JP) .................................. 2007-158348

(51) Int. Cl.
*H01L 41/187* (2006.01)
(52) U.S. Cl. ........................................................ 310/358
(58) Field of Classification Search .................. 310/358; 252/62.9 R, 62.9 PZ
See application file for complete search history.

(56) References Cited

U.S. PATENT DOCUMENTS

| | | | |
|---|---|---|---|
| 6,083,415 A | 7/2000 | Kimura et al. | |
| 6,093,339 A | 7/2000 | Kimura et al. | |
| 2002/0084723 A1* | 7/2002 | Kawazoe | 310/348 |
| 2004/0058797 A1 | 3/2004 | Nonoyama et al. | |
| 2007/0152183 A1* | 7/2007 | Furukawa et al. | 252/62.9 R |
| 2008/0061263 A1 | 3/2008 | Kawada et al. | |
| 2008/0252179 A1 | 10/2008 | Kimura et al. | |

FOREIGN PATENT DOCUMENTS

| | | | |
|---|---|---|---|
| EP | 1876156 | * | 9/2008 |
| WO | WO 2005/061413 | * | 7/2005 |
| WO | WO 2006/100807 | * | 9/2006 |
| WO | WO 2006/117990 | * | 9/2006 |

OTHER PUBLICATIONS

PCT Written Opinion.

* cited by examiner

*Primary Examiner* — Derek Rosenau
(74) *Attorney, Agent, or Firm* — Dickstein Shapiro LLP

(57) ABSTRACT

A piezoelectric porcelain composition includes a main ingredient represented by a general formula $((1-x)(K_{1-a-b}Na_aLi_b)(Nb_{1-c}Ta_c)O_3-xM2M4O_3)$ (where M2 represents Ca, Ba or Sr, M4 represents Zr, Sn or Hf, and $0.005 \leq x \leq 0.1$, $0 \leq a \leq 0.9$, $0 \leq b \leq 0.1$, $0 \leq a+b \leq 0.9$, and $0 \leq c \leq 0.3$), and Mn is contained in an amount ranging from 2 to 15 mol, relative to 100 mol of the main ingredient, and the M4 is contained in an amount ranging from 0.1 to 5.0 mol, relative to 100 mol of the main ingredient. Preferably, Ni is contained in an amount ranging from 0.1 to 5.0 mol, relative to 100 mol of the main ingredient, and also preferably Yb, In and the like specific rare earth elements is contained. A ceramic layer in a ceramic base is formed of this piezoelectric porcelain composition. As a result, the degree of sintering in a reductive atmosphere is improved, and a piezoelectric porcelain composition allowing co-sintering with Ni, and a piezoelectric ceramic electronic component using the same are realized.

22 Claims, 2 Drawing Sheets

PIEZOELECTRIC PORCELAIN COMPOSITION, AND PIEZOELECTRIC CERAMIC ELECTRONIC COMPONENT

This is a continuation of application Serial Number PCT/JP2008/056587, filed Apr. 2, 2008, the contents of which are incorporated herein by reference.

TECHNICAL FIELD

The present invention relates to a piezoelectric porcelain composition, and a piezoelectric ceramic electronic component, and more specifically, to a non-lead-based piezoelectric porcelain composition, and a piezoelectric ceramic electronic component such as a laminated piezoelectric actuator using the same.

BACKGROUND ART

In recent years, there has been an increased demand for a laminated piezoelectric ceramic electronic component such as a laminated piezoelectric actuator capable of obtaining a large displacement at low voltages.

Such a type of piezoelectric ceramic electronic component is generally produced by alternately laminating a piezoelectric ceramic layer and a conductive layer that is to become an internal electrode and co-sintering the laminate.

As an internal electrode material, conventionally, an Ag—Pd alloy is widely used, but the Ag—Pd alloy is relatively expensive so that most of the material cost is occupied by the internal electrode material. Also there is a drawback that sufficient reliability will not be ensured because of occurrence of migration of Ag at the time of driving the component by a low frequency area or DC voltage.

From the view point of suppressing the occurrence of migration, it is desired to use a low-migratory material. As such a low-migratory material, Pd, Pt, Ni and the like are known, but precious metal materials such as Pd and Pt are expensive, and may result in further rising in the material cost.

For effectively suppressing the occurrence of migration at a low cost, it is therefore preferred to use Ni which is available at a relatively low price.

Since Ni is easily oxidized when it is sintered in an ambient atmosphere, it need to be sintered in a reductive atmosphere, and a piezoelectric material capable of being co-sintered in a reductive atmosphere is required.

In the case of a conventional PZT (lead zirconate titanate)-based material or a PT (lead titanate)-based material, Pb will be reduced when sintering is conducted in a reductive atmosphere, so that a desired stable piezoelectric characteristic is not obtained.

On the other hand, compositions represented by the general formula: $(1-n)(K_{1-x-y}Na_xLi_y)_m(Nb_{1-z}Ta_z)O_3-nM1M2O_3$ (M1 represents a bivalent metal element, M2 represents a tetravalent metal element, $0.1 \leq x$, $y \leq 0.3$, $x+y<0.75$, $0 \leq z \leq 0.3$, $0.98 \leq m \leq 1.0$, $0<n<0.1$) are known as piezoelectric porcelain compositions not containing Pb (Patent document 1).

Even though it is a non-lead-based composition, the piezoelectric porcelain composition described in Patent document 1 realizes such excellent piezoelectric characteristics as a dielectric constant $\epsilon r$ of 1000 or higher, an electromechanical coupling coefficient kp of 25% or higher, and a Curie point Tc of 200° C. or higher.

Patent document 1: Japanese Unexamined Patent Publication JP-A 11-228227

DISCLOSURE OF THE INVENTION

Problem to be Solved by the Invention

The inventors of the present application attempted to produce a laminated piezoelectric actuator using a piezoelectric porcelain composition described in Patent document and Ni as an internal electric material.

However, when the piezoelectric porcelain composition and Ni were co-sintered in a reductive atmosphere, sufficient sintering was not achieved, revealing that it is difficult to obtain a piezoelectric body. Therefore, it is necessary to develop a novel piezoelectric porcelain composition suited for sintering in a reductive atmosphere for obtaining a laminated piezoelectric ceramic electronic component using Ni as an internal electrode material.

The present invention was devised in light of such circumstances, and it is an object of the present invention to provide a piezoelectric porcelain composition having an improved degree of sintering in a reductive atmosphere and enabling co-sintering with Ni, and a piezoelectric ceramic electronic component such as a laminated piezoelectric actuator using the same.

Means for Solving the Problem

The present inventor made diligent efforts to achieve the above object, and made the following findings. By containing a predetermined amount of Mn and a predetermined amount of a tetravalent element M4 (Zr, Sn, or Hf), as described above, in a composition system in which $M2M4O_3$ (M2 represents Ca, Ba or Sr, M4 represents Zr, Sn or Hf) is solid-solved in alkali metal niobate (hereinafter, referred to as "$KNbO_3$-based compound"), the degree of sintering in a reductive atmosphere is improved, and a result, co-sintering with Ni is enabled, and a piezoelectric porcelain composition having excellent piezoelectric characteristics can be obtained.

The present invention was made based on such findings, and a piezoelectric porcelain composition of the present invention includes a main ingredient represented by the general formula $\{(1-x)(K_{1-a-b}Na_aLi_b)(Nb_{1-c}Ta_c)O_3-xM2M4O_3\}$ where M2 represents at least one of Ca, Ba and Sr, M4 represents at least one of Zr, Sn and Hf, and x, a, b and c respectively satisfy $0.005 \leq x \leq 0.1$, $0 \leq a \leq 0.9$, $0 \leq b \leq 0.1$, $0 \leq a+b \leq 0.9$, and $0 \leq c \leq 0.3$), and 2 to 15 mol of Mn, relative to 100 mol of the main ingredient, and 0.1 to 5.0 mol of the M4, relative to 100 mol of the main ingredient.

Also as a result of a further diligent effort made by the present inventor, it was found that piezoelectric characteristics such as an electromechanical coupling coefficient and a piezoelectric constant can be improved by incorporating a predetermined amount of Ni.

That is, the piezoelectric porcelain composition of the present invention is characterized in that Ni is contained in an amount ranging from 0.1 to 5.0 mol, relative to 100 mol of the main ingredient.

Further, the present inventor repeated diligent efforts and found that piezoelectric characteristics can be improved and the breakdown electric field can be improved by containing a predetermined amount of a specific rare earth element M3.

That is, the piezoelectric porcelain composition of the present invention is characterized in that at least one element selected from the group consisting of Sc, In, Yb, Y, Nd, Eu, Gd, Dy, Sm, Ho, Er, Tb, Lu, La, and Pr is contained in an amount ranging from 0.1 to 5.0 mol, relative to 100 mol of the main ingredient.

The piezoelectric ceramic electronic component of the present invention is characterized in that in a piezoelectric ceramic electronic component in which an external electrode is formed on a surface of a piezoelectric ceramic base, and the piezoelectric ceramic base is formed of the piezoelectric porcelain composition.

Further, the piezoelectric ceramic electronic component of the present invention is characterized in that, in a piezoelectric ceramic electronic component including a piezoelectric ceramic base made up of an internal electrode and a piezoelectric ceramic layer that are alternately laminated and sintered, in which an external electrode is formed on the surface of the piezoelectric ceramic base, the piezoelectric ceramic layer is formed of the piezoelectric porcelain composition.

Also the piezoelectric ceramic electronic component of the present invention is characterized in that the internal electrode is mainly including Ni.

Effect of the Invention

According to the piezoelectric porcelain composition of the present invention, since the degree of sintering in a reductive atmosphere can be improved, desired and excellent piezoelectric characteristics can be obtained without leading to a sintering defect even when co-sintering with an internal electrode material mainly including Ni is conducted in a reductive atmosphere.

According to the piezoelectric ceramic electronic component of the present invention in which an external electrode is formed on a surface of a piezoelectric ceramic base, the piezoelectric ceramic base is formed by the piezoelectric porcelain composition, so that excellent piezoelectric characteristics can be obtained even when sintering is conducted in a reductive atmosphere.

According to the piezoelectric ceramic electronic component of the present invention including a piezoelectric ceramic base made up of an internal electrode and a piezoelectric ceramic layer alternately laminated and sintered, and in which an external electrode is formed on the surface of the piezoelectric ceramic base, the piezoelectric ceramic layer is formed of the piezoelectric porcelain composition, so that sintering using a material mainly including Ni as an internal electrode material is enabled, and a piezoelectric ceramic electronic component having excellent piezoelectric characteristics like low migratory property and practical value can be obtained at a low cost.

DESCRIPTION OF REFERENCE SYMBOLS

Figure 1:
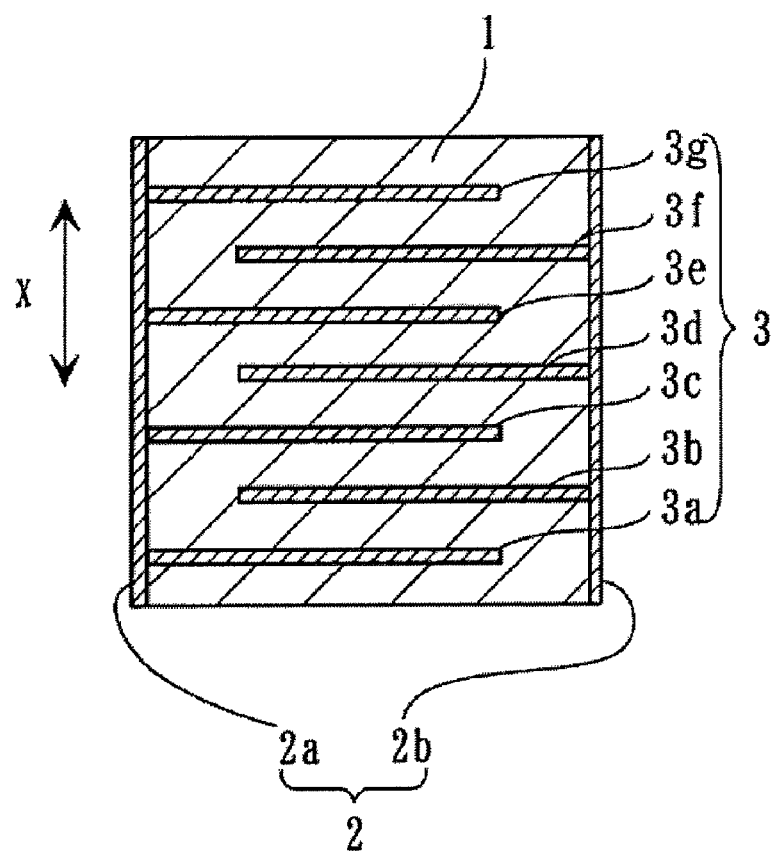
FIG. 1 is a cross sectional view showing one exemplary embodiment of a laminated piezoelectric actuator embodying a piezoelectric ceramic electronic component of the present invention.

1 Piezoelectric ceramic base
2a, 2b External electrode
3a to 3g Internal electrode

BEST MODE FOR CARRYING OUT THE INVENTION

Next, an exemplary embodiment of the present invention will be explained in detail.

A piezoelectric porcelain composition as one exemplary embodiment of the present invention is represented by the general formula (A)

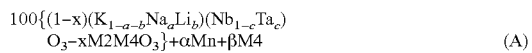

(A)

Here, M2 represents at least one element having a valence of 2 selected from Ca, Ba, and Sr (hereinafter, referred to as "specific bivalent element"), and M4 represents a least one element having a valence of 4 selected from Zr, Sn and Hf (hereinafter, referred to as "specific tetravalent element"). x, a, b, c, α and β satisfy the following numerical expressions (1) to (7).

$$0.005 \leq x \leq 0.1 \tag{1}$$

$$0 \leq a \leq 0.9 \tag{2}$$

$$0 \leq b \leq 0.1 \tag{3}$$

$$0 \leq a+b \leq 0.9 \tag{4}$$

$$0 \leq c \leq 0.3 \tag{5}$$

$$2 \leq \alpha \leq 15 \tag{6}$$

$$0.1 \leq \beta \leq 5.0 \tag{7}$$

That is, the present piezoelectric porcelain composition contains Mn and a specific tetravalent element M4 in amounts of predetermined ranges, relative to 100 mol of the main ingredient represented by the following general formula (B), and as a result, degree of sintering in a reductive atmosphere is improved.

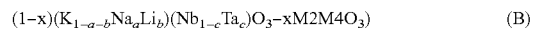

(B)

As a reason why degree of sintering in a reductive atmosphere is improved, the following can be supposed.

A complex perovskite compound represented by the general formula (B) is difficult to sinter in a reductive atmosphere. This is attributable to the fact that oxygen holes are easily formed during sintering in a reductive atmosphere, so that an alkali metal element (K, Na, Li) easily evaporates from the alkali metal site so that the entire electric charge remains neutral.

However, when Mn is added to the main ingredient represented by the general formula (B), Mn of +2 valence is solid-solved as an acceptor in a (NbTa) site, and as a result, electric charges of oxygen pores generated during sintering in a reductive atmosphere can be compensated to some extent. When a specific tetravalent element M4 is further added separately from a specific tetravalent element M4 in the main ingredient (general formula (B)), these elements of +4 valence are also solid-solved in the (NbTa) site as an acceptor, similar to Mn of +2 valence, so that electric charges of oxygen pores generated during sintering in a reductive atmosphere can be compensated to some extent, as is the case with adding Mn as described above. By adding both Mn and the specific tetravalent element M4 in appropriate amounts to the main ingredient, it is possible to sufficiently compensate electric charges of oxygen pores generated during sintering in a reductive atmosphere without affecting on piezoelectric characteristics. This makes it possible to prevent the alkali metal elements from leaving alkali metal sites, and enable stable sintering in a reductive atmosphere.

In other words, while the degree of sintering in a reductive atmosphere can not be sufficiently improved by adding Mn alone, or by adding only a specific tetravalent element M4 separately from the specific tetravalent element M4 in the main ingredient, the degree of sintering in a reductive atmosphere can be improved by the effect of adding both Mn and the specific tetravalent element M4 and desired excellent piezoelectric characteristics can be obtained.

The specific tetravalent element M4 in the main ingredient, and the specific tetravalent element M4 added separately from this in an amount of β mol relative to 100 mol of the main ingredient may be any one of Zr, Sn and Hf, and need not be the same element. For example, when the specific tetravalent element M4 in the main ingredient is Zr, the specific tetravalent element M4 added separately may be Sn or Hf.

Next, the reason why x, a, b, c, α, and β are defined as shown in the numerical expressions (1) to (7) will be described.

(1) x

By forming a main ingredient by solid-solving M2M4O$_3$ in a KNbO$_3$-based compound, excellent piezoelectric characteristics can be obtained. However, when a solid-solved molar ratio x of M2M4O$_3$ in the main ingredient is less than 0.005, the solid-solved amount of M2M4O$_3$ is too small to obtain desired piezoelectric characteristics. On the other hand, when the solid-solved molar ratio x is more than 0.1, the solid-solved amount of M2M4O$_3$ is excess and reduction in piezoelectric characteristics may be caused.

In light of the above, in the present embodiment, the blending amounts of the KNbO$_3$-based compound and M2M4O$_3$ are adjusted so that the solid-solved molar ratio x of M2M4O$_3$ in the main ingredient satisfies $0.005 \leq x3 \leq 0.1$.

(2) a, b

It is also preferred that part of K constituting alkali metal sites in the KNbO$_3$-based compound is substituted by another alkaline metal, such as Na or Li, as needed. However, when a substitution molar ratio a of Na is more than 0.9 or when a substitution molar ratio b of Li is more than 0.1, or when a total of the substitution molar ratio of these (a+b) is more than 0.9, the piezoelectric characteristics will be reduced.

In the above exemplary embodiment, therefore, blending amounts of ingredients of the composition are adjusted so that the above substitution molar ratios a and b satisfy $0 \leq a \leq 0.9$, $0 \leq b \leq 0.1$, and $0 \leq a+b \leq 0.9$.

(3) c

It is also preferred to substitute part of Nb in the KNbO$_3$-based compound by Ta as needed. However, when a substitution molar ratio a of Ta is more than 0.3, the piezoelectric characteristics will be reduced.

In the above exemplary embodiment, therefore, blending amounts of ingredients of the composition are adjusted so that the above substitution molar ratio c satisfies $0 \leq a \leq 0.3$.

(4) α

By incorporating Mn into the main ingredient as described above, it is possible to improve the degree of sintering in a reductive atmosphere in cooperation with the effect of adding the specific tetravalent element M4. However, when a content molar amount α of Mn is less than 2 mol, relative to 100 mol of the main ingredient, the effect of adding Mn is not exerted, and a sintering defect arises and the insulation resistance decreases. This may result in a polarization defect. On the other hand, when the content molar amount α of Mn is more than 15 mol, relative to 100 mol of the main ingredient, and is thus in excess, the piezoelectric characteristics may be reduced.

In the present embodiment, therefore, an adding amount Mn is adjusted so that the content molar amount α satisfies $2 \leq \alpha \leq 15$ relative to 100 mol of the main ingredient. For obtaining the better piezoelectric characteristics, the above content molar amount α more preferably satisfies $5 \leq \alpha \leq 10$.

(5) β

By incorporating a specific tetravalent element M4 into the main ingredient separately from the specific tetravalent element M4 in the main ingredient, it is possible to improve the degree of sintering in a reductive atmosphere in cooperation with the adding effect of Mn. However, when a content molar amount β of the specific tetravalent element M4 is less than 0.1 mol, relative to 100 mol of the main ingredient, the adding effect of the specific tetravalent element M4 cannot be exerted, so that a sintering defect occurs and the insulation resistance decreases, which may lead a polarization defect. On the other hand, when the content molar amount β of the specific tetravalent element M4 is more than 5.0 mol, relative to 100 mol of the main ingredient and thus is in excess, a decrease in piezoelectric characteristics may be caused.

In the present embodiment, therefore, an adding amount of the specific tetravalent element M4 is adjusted so that the content molar amount β satisfies $0.1 \leq \beta \leq 5.0$, relative to 100 mol of the main ingredient. For obtaining better piezoelectric characteristics, the content molar amount β more preferably satisfies $1.0 \leq \beta \leq 5.0$.

In the present embodiment, since the ingredients of the composition are blended so that the general formula (A) satisfies the numerical expressions (1) to (7), it is also possible to improve the degree of sintering in a reductive atmosphere. Therefore, even when Ni is used as an internal electrode material, it is possible to conduct co-sintering and to obtain a piezoelectric porcelain composition having desired excellent piezoelectric characteristics.

Furthermore, it is also preferred in the present invention to include Ni as needed, and this makes it possible to improve the piezoelectric characteristics such as an electromechanical coefficient and a piezoelectric constant.

In this case, the piezoelectric porcelain composition is represented by a general formula (C).

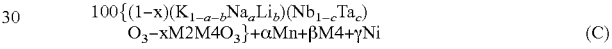

$$100\{(1-x)(K_{1-a-b}Na_aLi_b)(Nb_{1-c}Ta_c)O_3-xM2M4O_3\}+\alpha Mn+\beta M4+\gamma Ni \quad (C)$$

However, when Ni is contained in the piezoelectric porcelain composition, it is preferably in an amount of 0.1 to 5.0 mol, relative to 100 mol of the main ingredient. That is, when a content molar amount γ of Ni is less than 0.1 mol, relative to 100 mol of the main ingredient, the adding effect cannot be exerted. On the other hand, since Ni is easily oxidized when sintering is conducted in an ambient atmosphere in the course of production of a piezoelectric porcelain composition, it is necessary to conduct sintering in a reductive atmosphere. Accordingly, when Ni is added in an amount exceeding 5.0 mol, relative to 100 mol of the main ingredient, Ni that is no longer able to be solid-solved in the main ingredient may deposit as metal, with the result that reduction in the insulation resistance and difficulty in polarization may be caused.

Addition of Ni to the piezoelectric porcelain composition may be achieved by intended addition into a ceramic material, or may be achieved in such a form that diffusion from the internal electrode will result in addition into the piezoelectric porcelain composition when Ni is used as an internal electrode material for a ceramic piezoelectric component.

Further, it is also preferred in the present invention to add at least one trivalent rare earth element (hereinafter, referred to as "specific rare earth element") M3 selected from the group consisting of Sc, In, Yb, Nd, Eu, Gd, Dy, Sm, Ho, Er, Tb, Lu, La and Pr as needed.

In this case, the piezoelectric porcelain composition is represented by a general formula (D).

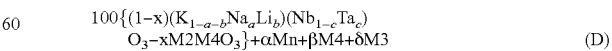

$$100\{(1-x)(K_{1-a-b}Na_aLi_b)(Nb_{1-c}Ta_c)O_3-xM2M4O_3\}+\alpha Mn+\beta M4+\delta M3 \quad (D)$$

Since the specific rare earth element M3 as mentioned above is solid-solved in the alkali metal site as a donor, it seems that it promotes solid solution of Mn and the specific tetravalent element M4 serving as an acceptor in the (NbTa) site into crystalline particles, while making these Mn and specific tetravalent element M4 stably reside in the crystalline particles. Therefore, the degree of sintering in a reductive atmosphere is further stabilized, so that contribution to improvement in piezoelectric characteristics is possible.

Additionally, the breakdown electric field can be improved by adding the specific rare earth element M3 as described above, and hence use in a higher electric field becomes possible. In other words, it becomes possible to further thin the ceramic layer, and as a result of such thinning, more displacement can be obtained.

However, the molar amount δ when the specific rare earth element M3 is added is preferably 0.1 to 5.0 mol, relative to 100 mol of the 100 mol of the main ingredient. This is because when the content molar amount δ of the specific rare earth element M3 is less than 0.1 mol, relative to 100 mol of the main ingredient, the effect of adding the same is not exerted, while when it is more than 5.0 mol, relative to 100 mol of the main ingredient, a sintering defect is caused, and the insulation resistance is decreased, so that a polarization defect may be caused.

Next, a piezoelectric ceramic electronic component produced by using the aforementioned piezoelectric porcelain composition will be explained.

FIG. 1 is a sectional view showing an exemplary embodiment of a laminated piezoelectric actuator as a piezoelectric ceramic electronic component according to the present invention. The laminated piezoelectric actuator includes a piezoelectric ceramic base 1, and external electrodes 2 (2a, 2b) formed of a conductive material such as Ag, formed on each end of the piezoelectric ceramic base 1. The ceramic base 1 is produced by alternately laminating a piezoelectric layer formed of a piezoelectric porcelain composition of the present invention, and an internal electrodes 3 (3a to 3g) formed of a conductive material containing Ni as a main ingredient, followed by sintering.

In the laminated piezoelectric actuator, one end of the internal electrodes 3a, 3c, 3e, 3g are electrically connected with the one external electrode 2a, while one end of the internal electrodes 3b, 3d, 3f are electrically connected with the other external electrode 2b. When when voltage is applied between the external electrode 2a and the external electrode 2b, displacement occurs in a laminating direction as denoted by the arrow x by the piezoelectric longitudinal effect.

Next, a production method of the laminated piezoelectric actuator will be explained in detail.

First, as ceramic base materials, a K compound containing K, a Nb compound containing Nb, a M4 compound containing a specific tetravalent element M4, and a Mn compound containing bivalent Mn are prepared, and further a M2 compound containing a specific bivalent element M2 are prepared. Also, a Na compound containing Na, a Li compound containing Li, and a Ta compound containing Ta, and further a M3 compound containing specific rare earth element M3 are prepared as needed. The compounds may exist in any of the oxide, carbonate, and hydroxide forms.

Next, a predetermined amount of the ceramic base material is weighed, and the weighed object is put into a ball mill containing milling media such as PSZ balls, and thoroughly wet-milled in a solvent such as ethanol to obtain a mixture.

After drying, the mixture is calcinated at a predetermined temperature (for example, 850 to 1000° C.) to obtain a calcinated object.

Next, lumps of the calcinated object obtained in this manner are broken, mixed with an organic binder and a dispersing agent, and wet-mixed in a ball mill using pure water or the like as a solvent, to obtain a ceramic slurry. Then a molding process using a doctor blade method or the like is conducted to produce a ceramic green sheet.

Figure 2:
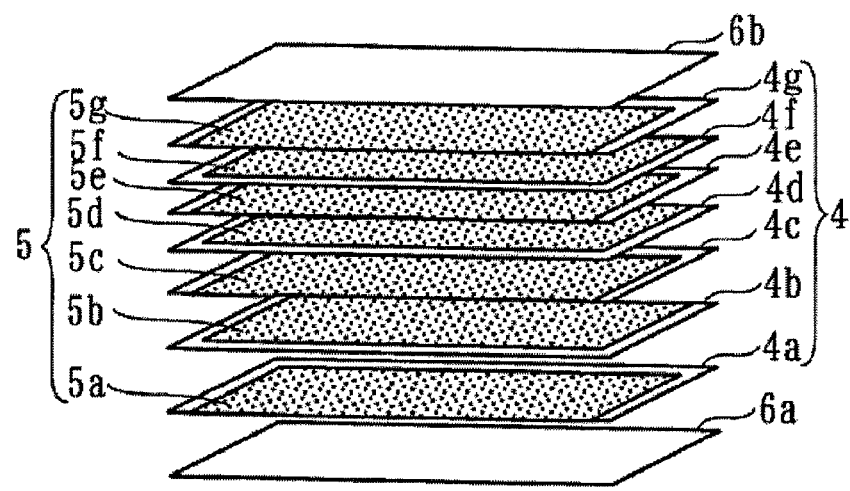
FIG. 2 is a perspective view of a ceramic green sheet obtained in the course of production of the piezoelectric actuator.

Then using a conductive paste for internal electrode containing Ni as its main ingredient, a predetermined shape of conductive layer 5 (5a to 5g) is formed as shown in FIG. 2, by screen printing on the ceramic green sheet 4 (4a to 4g).

Next, after laminating the ceramic green sheets 4a to 4g on which these conductive layers 5a to 5g are formed, the laminate is sandwiched between ceramic green sheets 6a, 6b on which conductive layers 5a to 5g are not formed, and then crimped. As a result, the a ceramic laminate in which the conductive layers 5a to 5g and the ceramic green sheets 4a to 4g are alternately laminated is produced. Then, the ceramic laminate is cut into a predetermined dimension and accommodated in a aluminum scabbard and subjected to a binder-removing treatment at a predetermined temperature (for example, 250 to 500° C.), and then sintered at a predetermined temperature (for example, 1000 to 1160° C.) in an reductive atmosphere, to form the piezoelectric ceramic base 1 in which the internal electrodes 3a to 3g are embedded.

Figure 3:
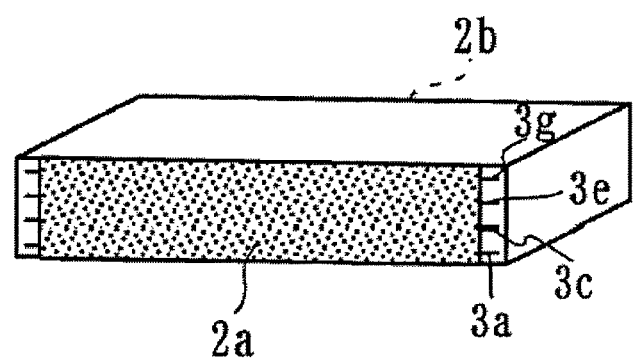
FIG. 3 is a perspective view of the piezoelectric actuator.

Next, a conductive paste for external electrode formed of Ag or the like is applied on both ends of the piezoelectric ceramic base 1, and sintered at a predetermined temperature (for example, 750° C. to 850° C.), to form the external electrodes 2a, 2b as shown in FIG. 3. Thereafter, a predetermined polarization treatment is executed to produce a laminated piezoelectric actuator. Here, the external electrodes 2a, 2b may be formed by a thin-film forming method such as, for example, sputtering or vacuum evaporation insofar as they have excellent adherence.

As described above, since the ceramic green sheet (ceramic layer) 4 in the laminated piezoelectric actuator is formed of the piezoelectric porcelain composition, and the internal electrode contains Ni as a main ingredient, it is possible to obtain a piezoelectric ceramic electronic component having excellent piezoelectric characteristics and having excellent practicability that is effective for suppressing occurrence of migration at a low cost.

The present invention is not limited to the above exemplary embodiment. For example, the specific bivalent element M2 may contain other bivalent elements, for example, Mg as far as it contains at least either one of Ca, Sr, and Ba. That is, Mg can exist in the crystalline particles while it is solid-solved in Ca, Sr or Ba, however, it will not influence on characteristics.

In the above exemplary embodiment, a case where Ni is contained in the piezoelectric porcelain composition is shown in the general formula (C), and a case where the specific rare earth element M3 is contained in the piezoelectric porcelain composition is shown in the general formula (D), but both Ni and the specific rare earth element M3 may be contained within the aforementioned composition ranges.

In this case, the piezoelectric porcelain composition may be represented by a general formula (E).

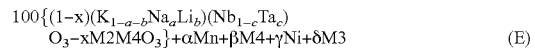

$$100\{(1-x)(K_{1-a-b}Na_aLi_b)(Nb_{1-c}Ta_c)O_3 - xM2M4O_3\} + \alpha Mn + \beta M4 + \gamma Ni + \delta M3 \quad (E)$$

Next, Examples of the present invention will be concretely described.

EXAMPLE 1

In Example 1, samples in containing different amounts of Mn and the specific tetravalent element M4, relative to the main ingredient were prepared, and their characteristics were evaluated.

First, as a ceramic base material, $K_2CO_3$, $Na_2CO_3$, $Li_2CO_3$, $Nb_2O_5$, $CaCO_3$, $SrCO_3$, $BCO_3$, $ZrO_2$, $SnO_2$, $HfO_2$, MnO, and $Yb_2O_3$ were prepared. Then weighing was conducted to achieve compositions having M2, M4, α, β and δ as shown in Table 1 in the general formula [100{0.96 $(K_{0.44}Na_{0.54}Li_{0.02})NbO_3-0.04M2M4O_3$}+αMn+βM4+ δYb]. Then these weighed objects were put into a ball mill containing PSZ balls, and wet-mixed for about 90 hours in ethanol as a solvent. The obtained mixture was dried, and calcinated at a temperature of 900° C. to obtain a calcinated object.

After breaking lumps of the calcinated object, the calcinated object was put into a ball mill together with a binder, a dispersing agent and pure water, and thoroughly wet-mixed, and then formed by a doctor blade method to obtain a ceramic green sheet having a thickness of 120 μm.

Next, a plurality of the ceramic green sheets were laminated so that the thickness was about 1 mm, and crimped by pressing at a pressure of about $2.45 \times 10^7$ Pa, and punched into a disc shape of 12 mm in diameter, to obtain a ceramic formed body.

Then the ceramic formed body was sintered for two hours at a temperature of about 1100° C. in a reductive atmosphere which is adjusted to be reductive side by 0.5 of Ni/NiO equilibrium oxygen partial pressure, to obtain a disc-like piezoelectric ceramic. Then an external electrode of a double-layered structure made up of a Ni—Cu alloy and Ag was formed on both principal faces of the piezoelectric ceramic by sputtering, to obtain samples of Sample Nos. 1 to 31.

For each sample of Sample Nos. 1 to 31, an insulation resistance was measured by using a DC voltmeter, and the logarithm of an insulation resistance $\log(\rho/\Omega \cdot cm)$ was calculated.

Then for each sample, an electric field of 3.0 kV/mm was applied for 30 minutes in insulating oil at 80° C. to effect a polarization treatment.

Next, for each sample, dielectric loss tan δ, dielectric constant εr, electromechanical coupling coefficient kp of radial oscillation, piezoelectric constant $d_{33}$ and the Curie point Tc were measured.

The dielectric loss tan δ was measured by using an impedance analyzer. The dielectric constant εr was determined from capacitance measured by an impedance analyzer and dimension of the sample. The electromechanical coupling coefficient kp of radial oscillation was determined by an resonance-antiresonance method using an impedance analyzer.

The piezoelectric constant $d_{33}$ was determined from electric charge that was generated when force of $0.25N_{rms}$ was applied using a $d_{33}$ meter. The Curie point Tc was determined by measuring temperature characteristic of a dielectric constant εr by an impedance analyzer, and calculating maximum temperature of the dielectric constant εr.

Table 1 shows ingredient compositions of Sample Nos. 1 to 31, and Table 2 shows measuring results of these samples. A sample exhibiting an electromechanical coupling coefficient kp of 15% or higher, a piezoelectric constant $d_{33}$ of 80 pC/N or higher and a Curie point Tc of 150° C. or higher was determined as a good article.

TABLE 1

| Sample No. | 100 [0.96 $(K_{0.44} Na_{0.54} Li_{0.02})$ $NbO_3$ – 0.04M2M4O$_3$] + αMn + βM4 δYb | | | | |
|---|---|---|---|---|---|
| | M2 | M4 | α | β | δ |
| 1 | Ca | Zr | 10 | 3.0 | 0.5 |
| 2 | Ca | Zr | 0 | 3.0 | 0.5 |
| 3 | Ca | Zr | 1 | 3.0 | 0.5 |
| 4 | Ca | Zr | 2 | 3.0 | 0.5 |
| 5 | Ca | Zr | 5 | 3.0 | 0.5 |
| 6 | Ca | Zr | 15 | 3.0 | 0.5 |
| 7* | Ca | Zr | 20 | 3.0 | 0.5 |
| 8* | Ca | Zr | 5 | 0.0 | 0.5 |
| 9 | Ca | Zr | 5 | 4.0 | 0.5 |
| 10 | Ca | Zr | 5 | 5.0 | 0.5 |
| 11* | Ca | Zr | 5 | 7.0 | 0.5 |
| 12* | Ca | Zr | 5 | 10.0 | 0.5 |
| 13 | Ca | Zr | 10 | 0.1 | 0.5 |
| 14 | Ca | Zr | 15 | 0.1 | 0.5 |
| 15* | Ca | Zr | 20 | 0.1 | 0.5 |
| 16* | Ca | Zr | 1 | 5.0 | 0.5 |
| 17 | Ca | Zr | 2 | 5.0 | 0.5 |
| 18 | Ca | Zr | 10 | 5.0 | 0.5 |
| 19 | Ca | Zr | 15 | 5.0 | 0.5 |
| 20* | Ca | Zr | 20 | 5.0 | 0.5 |
| 21* | Ca | Zr | 1 | 7.0 | 0.5 |
| 22* | Ca | Zr | 2 | 7.0 | 0.5 |
| 23* | Ca | Zr | 10 | 7.0 | 0.5 |
| 24 | Ba | Zr | 5 | 3.0 | 0.5 |
| 25 | Sr | Zr | 5 | 3.0 | 0.5 |
| 26 | Ca | Zr | 5 | 0.1 | 0.0 |
| 27 | Ca | Zr | 5 | 1.0 | 0.0 |
| 28* | Ca | Zr | 1 | 0.1 | 0.0 |
| 29 | Ca | Zr | 2 | 0.1 | 0.0 |
| 30 | Ca | Sn | 10 | 3.0 | 0.5 |
| 31 | Ca | Hf | 10 | 3.0 | 0.5 |

The mark * is out of the scope of the present invention.

TABLE 2

| Sample No. | Logarithm of insulation resistance log (p/Ω · cm) | Dielectric loss tan δ (%) | Dielectric constant εr | Electromechanical coupling coefficient kp (%) | Piezoelectric constant $d_{33}$ (pC/N) | Curie point Tc (° C.) |
|---|---|---|---|---|---|---|
| 1 | 11.9 | 5.7 | 1560 | 30.5 | 143 | 190 |
| 2* | 6.0 | — | — | — | — | — |
| 3* | 7.5 | — | — | — | — | — |
| 4 | 10.5 | 5.6 | 1260 | 22.7 | 115 | 280 |
| 5 | 10.9 | 6.2 | –1410 | 32.5 | 142 | 260 |
| 6 | 12.0 | 4.1 | 1630 | 20.1 | 120 | 150 |
| 7* | 12.1 | 4.3 | 1650 | 10 | 28 | 110 |
| 8* | 6.0 | — | — | — | — | — |
| 9 | 11.3 | 6.1 | 1380 | 25.3 | 102 | 260 |
| 10 | 11.3 | 6.1 | 1380 | 25.3 | 102 | 260 |
| 11* | 10.4 | 7.4 | 1400 | 10 | 28 | 240 |
| 12* | 10.6 | 7.2 | 1420 | 7.5 | 25 | 230 |
| 13 | 10.8 | 7.2 | 1310 | 17.1 | 88 | 220 |
| 14 | 11.8 | 4.5 | 1320 | 17.8 | 89 | 170 |
| 15* | 12.0 | 4 | 1620 | 8 | 15 | 120 |

TABLE 2-continued

| Sample No. | Logarithm of insulation resistance log (p/Ω · cm) | Dielectric loss tan δ (%) | Dielectric constant εr | Electromechanical coupling coefficient kp (%) | Piezoelectric constant $d_{33}$ (pC/N) | Curie point Tc (° C.) |
|---|---|---|---|---|---|---|
| 16* | 7.8 | — | — | — | — | — |
| 17 | 10.5 | 5.6 | 1260 | 22.3 | 110 | 280 |
| 18 | 11.9 | 5.2 | 1510 | 21.5 | 123 | 190 |
| 19 | 12.0 | 4.1 | 1620 | 20.1 | 117 | 150 |
| 20* | 12.1 | 4.3 | 1650 | 10.5 | 30 | 110 |
| 21* | 6.8 | — | — | — | — | — |
| 22* | 11.1 | 5 | 1330 | 10.3 | 28 | 270 |
| 23* | 11.4 | 5.3 | 1650 | 10.7 | 35 | 180 |
| 24 | 10.8 | 5.8 | 1520 | 22.5 | 110 | 260 |
| 25 | 11.0 | 5.2 | 1230 | 23.5 | 121 | 260 |
| 26 | 11.0 | 5.3 | 1300 | 17.8 | 89 | 280 |
| 27 | 11.3 | 6.1 | 1380 | 25.3 | 102 | 260 |
| 28* | 5.8 | — | — | — | — | — |
| 29 | 11.0 | 5.5 | 1320 | 16.8 | 85 | 290 |
| 30 | 10.4 | 7.2 | 1320 | 28.2 | 120 | 180 |
| 31 | 11.0 | 6.1 | 1420 | 29.1 | 132 | 190 |

The mark * is out of the scope of the present invention.

Sample No .1 to 23 are samples in which M2 is formed of Ca, M4 is formed of Zr, the content molar amount δ of Yb is 0.5 mol, relative to 100 mol of main ingredient, and the molar amounts α, β of Mn and Zr are varied.

In Sample No. 2, α is 0, and Mn is not contained in the piezoelectric porcelain composition. Sufficient sintering was not achieved in a reductive atmosphere, so that the logarithm of an insulation resistance log(ρ/Ω·cm) was as low as 6.0, resulting in a polarization defect.

In Sample Nos. 3, 16 and 21, since the content molar amount α of Mn is as small as 1 mol, relative to 100 mol of the main ingredient, and sufficient sintering is not achieved in a reductive atmosphere, the logarithm of an insulation resistance log(ρ/Ω·cm) was as low as 7.5, 7.8, or 6.8, respectively, and polarization was inadequate.

On the other hand, since the content molar amount α of Mn is as large as 20 mol in Sample Nos. 7, 15 and 20, relative to 100 mol of the main ingredient, the electromechanical coupling coefficient kp was 15% or less in every sample, and the piezoelectric constant $d_{33}$ was 80 pC/N or less, revealing a decrease in piezoelectric characteristics. It was also found that a Curie point Tc decreased to 150° C. or less.

In Sample No. 8, since β is 0, and Zr is not contained in the piezoelectric porcelain composition, sufficient sintering was not achieved in a reductive atmosphere, and the logarithm of an insulation resistance log(ρ/Ω·cm) was as low as 6.0, and polarization was inadequate.

In Sample Nos. 11, 22 and 23, the content molar amount β of Zr is as large as 7.0 mol, relative to 100 mol of the main ingredient, the electromechanical coupling coefficient kp was 15% or less, and the piezoelectric constant $d_{33}$ was 80 pC/N or less in every sample, revealing a decrease in piezoelectric characteristics.

In contrast to this, since the content molar amount α of Mn is 2 to 15 mol, relative to 100 mol of the main ingredient, and the content molar amount β of Zr is 0.1 to 5.0 mol, relative to 100 mol of the main ingredient which fall within the ranges of the present invention in Sample Nos. 1, 4 to 6, 9, 10, 13, 14, and 17 to 19, a sintering defect was not caused even when sintering was conducted in a reductive atmosphere, revealing that such excellent piezoelectric characteristics as an electromechanical coupling coefficient kp of 15% or more, and a piezoelectric constant $d_{33}$ of 80 pC/N or more, and a Curie point Tc of 150° C. or more were obtained.

It was also proved that the electromechanical coupling coefficient kp and the piezoelectric constant $d_{33}$ are further improved when the content molar amount α of Mn is 5 to 10 mol, relative to 100 mol of the main ingredient and the content molar amount β of Zr, relative to 100 mol of the main ingredient is 1 to 5 mol.

Sample Nos. 24 and 25 are samples in which M2 element is Ba and Sr, while the content molar amounts α, β and δ of Mn, Zr and Yb, relative to 100 mol of the main ingredient are identical to those in Sample No. 5.

As is apparent from Sample Nos. 24 and 25, even when Ba or Sr instead of Ca was used as M2, sintering in a reductive atmosphere was possible. It was also found that a piezoelectric porcelain composition having such excellent piezoelectric characteristics as an electromechanical coupling coefficient kp of 15% or more, and a piezoelectric constant $d_{33}$ of 80 pC/N or more, and a Curie point Tc of 150° C. or more was obtained.

Sample Nos. 26 to 29 are samples not containing Yb.

In Sample No. 28, the content molar amount α of Mn is as small as 1 mol, relative to 100 mol of the main ingredient, and it could not be sufficiently sintered in a reductive atmosphere, and hence the logarithm of an insulation resistance log(ρ/Ω·cm) was as low as 5.8 and a polarization defect was caused.

In contrast to this, since the content molar amount α of Mn is 2 to 5 mol, relative to 100 mol of the main ingredient, and the content molar amount β of Zr is 0.1 to 1.0 mol, relative to 100 mol of the main ingredient, which fall within the ranges of the present invention, in Sample Nos. 26, 27 and 29, a sintering defect was not caused even when sintering was conducted in a reductive atmosphere. And these samples had such excellent piezoelectric characteristics as an electromechanical coupling coefficient kp of 15% or more, and a piezoelectric constant $d_{33}$ of 80 pC/N or more, and a Curie point Tc of 150° C. or more.

In brief, it was confirmed that even when the specific rare earth element M3 is not contained in the piezoelectric porcelain composition, sintering in a reductive atmosphere is possible insofar as the content molar amounts of Mn and Zr fall within the ranges of the present invention, and a piezoelectric ceramic electronic component having a Curie point Tc of 150° C. or more and desired piezoelectric characteristics is obtained.

Sample Nos. 30 and 31 are samples having the same composition as that of Sample No. 1 except that the specific tetravalent element M4 is replaced by Sn or Hf.

As is apparent from Sample Nos. 30 and 31, it was found that even when Sn or Hf was used instead of Zr as M4, such excellent piezoelectric characteristics as an electromechanical coupling coefficient kp of 28.2 to 29.1%, and a piezoelectric constant $d_{33}$ of 120 to 132 pC/N, and such a high Curie point Tc as 180 to 190° C. were obtained.

EXAMPLE 2

In Example 2, samples having various molar ratios a, b, c and x in the main ingredient compositions were prepared and their characteristics were evaluated.

First, as a ceramic base material, $K_2CO_3$, $Na_2CO_3$, $Li_2CO_3$, $Nb_2O_5$, $Ta_2O_5$, $CaCO_3$, $ZrO_2$, MnO and $Yb_2O_3$ were prepared. Then weighing was conducted to achieve compositions having a, b, c and x as shown in Table 3 in the general formula $[100\{1-x(K_{1-a-b}Na_aLi_b)(Nb_{1-c}Ta_c)O_3-xCaZrO_3\}+\alpha Mn+\beta Zr+0.5Yb]$ ($\alpha$ is 5 or 2, and $\beta$ is 3.0 or 1.0).

Then samples of Sample Nos. 41 to 52 were prepared in a similar manner and procedure as in Example 1.

Next, for each sample of Sample Nos. 41 to 52, the logarithm of an insulation resistance $\log(\rho/\Omega\cdot cm)$ was measured by using a DC voltmeter, and then an electric field of 3.0 kV/mm was applied for 30 minutes in insulating oil at 80° C. to effect a polarization treatment.

Next, for each sample, dielectric loss tan δ, dielectric constant εr, electromechanical coupling coefficient kp of radial oscillation, piezoelectric constant $d_{33}$ and Curie point Tc were measured in a similar manner as in Example 1.

Table 3 shows ingredient compositions of Sample Nos. 41 to 52, and Table 4 shows measuring results of these samples. Like Example 1, samples exhibiting an electromechanical coupling coefficient kp of 15% or higher, a piezoelectric constant $d_{33}$ of 80 pC/N or higher and a Curie point Tc of 150° C. or higher was determined as a good article.

TABLE 3

| Sample No. | 100 [(1 − x) $K_{1-a-b}Na_aLi_b$] ($Nb_{1-c}Ta_c$) $O_3$ − $xCaZrO_3$] + αMn + βZr 0.5Yb | | | | | | |
|---|---|---|---|---|---|---|---|
| | a | b | a + b | c | x | α | β |
| 41 | 0.00 | 0.02 | 0.02 | 0.0 | 0.04 | 5 | 3.0 |
| 42 | 0.90 | 0.02 | 0.92 | 0.0 | 0.04 | 5 | 3.0 |
| 43* | 0.95 | 0.02 | 0.97 | 0.0 | 0.04 | 5 | 3.0 |
| 44 | 0.54 | 0.00 | 0.54 | 0.0 | 0.04 | 5 | 3.0 |
| 45 | 0.54 | 0.10 | 0.64 | 0.0 | 0.04 | 5 | 3.0 |
| 46* | 0.54 | 0.20 | 0.74 | 0.0 | 0.04 | 5 | 3.0 |
| 47 | 0.54 | 0.02 | 0.56 | 0.3 | 0.01 | 5 | 3.0 |
| 48* | 0.54 | 0.02 | 0.56 | 0.4 | 0.01 | 5 | 3.0 |
| 49* | 0.54 | 0.02 | 0.56 | 0.0 | 0.00 | 5 | 3.0 |
| 50 | 0.54 | 0.02 | 0.56 | 0.0 | 0.005 | 5 | 3.0 |
| 51 | 0.54 | 0.02 | 0.56 | 0.0 | 0.10 | 2 | 1.0 |
| 52* | 0.54 | 0.02 | 0.56 | 0.0 | 0.15 | 2 | 1.0 |

The mark * is out of the scope of the present invention

TABLE 4

| Sample No. | Logarithm of insulation resistance log (ρ/Ω · cm) | Dielectric loss tan δ (%) | Dielectric constant εr | Electromechanical coupling coefficient kp (%) | Piezoelectric constant $d_{33}$ (pC/N) | Curie point Tc (° C.) |
|---|---|---|---|---|---|---|
| 41 | 10.5 | 8.7 | 1200 | 20 | 100 | 280 |
| 42 | 12.4 | 3.2 | 1000 | 21.5 | 101 | 280 |
| 43* | 11.5 | 6.2 | 620 | 8.9 | 27 | 280 |
| 44 | 11.2 | 5.8 | 1350 | 32.7 | 135 | 260 |
| 45 | 10.7 | 6.2 | 1550 | 23.7 | 121 | 260 |
| 46* | 10.5 | 7.8 | 1210 | 8.1 | 40 | 260 |
| 47 | 11.4 | 5.4 | 1360 | 25.4 | 112 | 250 |
| 48* | 11.2 | 5.8 | 1540 | 8.9 | 40 | 220 |
| 49* | 12.1 | 3.4 | 300 | 27.1 | 70 | 370 |
| 50 | 12.1 | 3.2 | 620 | 25.1 | 101 | 360 |
| 51 | 11.7 | 5.5 | 1850 | 20.1 | 114 | 160 |
| 52* | 10.6 | 7.2 | 1820 | 7.8 | 38 | 150 |

The mark * is out of the scope of the present invention

As to Sample No. 43, the substitution molar ratio a of Na is 0.95, and hence the blending molar amount of Na is too large, so that the electromechanical coupling coefficient kp was as low as 8.9%, and the piezoelectric constant $d_{33}$ was also as low as 27 pC/N, revealing that excellent piezoelectric characteristics were not obtained.

In Sample No. 46, the substitution molar amount b of Li is 0.20, and hence the blending molar amount of Li is too large, so that the electromechanical coupling coefficient kp was as low as 8.1%, and the piezoelectric constant $d_{33}$ was also as low as 40 pC/N, revealing that excellent piezoelectric characteristics were not obtained.

As to Sample No. 48, the substitution molar amount c of Ta is 0.4, and hence a blending molar amount of Ta is too large, so that the electromechanical coupling coefficient kp was as low as 8.9%, and the piezoelectric constant $d_{33}$ was also as low as 40 pC/N, revealing that excellent piezoelectric characteristics were not obtained.

In Sample No. 49, the solid-solved molar amount x of $CaZrO_3$ is zero, and $CaZrO_3$ is not solid-solved in a $KNbO_3$-based compound, so that the dielectric constant εr was as low as 300, and the piezoelectric constant $d_{33}$ was as low as 70 pC/N, revealing that excellent piezoelectric characteristics were not obtained.

As to Sample No. 52, the solid-solved molar amount x of $CaZrO_3$ is 0.15, and the solid-solved molar amount of $CaZrO_3$ is too large, so that the electromechanical coupling coefficient kp was as low as 7.8%, and the piezoelectric constant $d_{33}$ was as low as 38 pC/N, revealing that excellent piezoelectric characteristics were not obtained.

In contrast to this, it was found in Sample Nos. 41, 42, 44, 45, 47, 50 and 51 that such excellent piezoelectric characteristics as an electromechanical coupling coefficient kp of 15% or more, and a piezoelectric constant $d_{33}$ of 80 pC/N or more, and a Curie point Tc of 150° C. or more were obtained because a, b, c and x satisfy $0 \leq a \leq 0.9$, $0 \leq b \leq 0.1$, $0 \leq a+b \leq 0.9$, $0 \leq c \leq 0.3$, and $0.005 \leq x \leq 0.1$, respectively which fall within the ranges of the present invention.

EXAMPLE 3

In Example 3, samples and containing Ni in addition to the composition of Sample Nos. 27 in Example 1 and having various contents of Ni were prepared, and characteristics of these samples were evaluated.

First, as a ceramic base material, $K_2CO_3$, $Na_2CO_3$, $Li_2CO_3$, $Nb_2O_5$, $Ta_2O_5$, $CaCO_3$, $ZrO_2$, MnO and NiO were prepared. Then weighing was conducted so that γ has the composition as shown in Table 5 in the general formula $[100\{0.96(K_{0.44}Na_{0.54}Li_{0.02})NbO_3-0.04CaZrO_3\}+5Mn+1.0Zr+\gamma Ni]$.

Then samples of Sample Nos. 61 to 64 were prepared in a similar manner and procedure as in Example 1.

Next, for each sample of Sample Nos. 61 to 64, the logarithm of an insulation resistance $\log(\rho/\Omega\cdot cm)$ was measured by using a DC voltmeter, and then an electric field of 3.0 kV/mm was applied for 30 minutes in insulating oil at 80° C. to effect a polarization treatment.

Next, for each sample, dielectric loss tan δ, dielectric constant εr, electromechanical coupling coefficient kp of radial oscillation, piezoelectric constant $d_{33}$ and Curie point Tc were measured in a similar manner as in Example 1.

Table 5 shows ingredient compositions of Sample Nos. 61 to 64, and Table 6 shows measuring results of these samples. In Table 5 and Table 6, Sample No. 27 of Table 1 is referred again for comparison.

TABLE 5

| Sample No. | $100 [0.96 (K_{0.44}Na_{0.54}Li_{0.02})(NbO_3 - 0.04CaZrO_3) + 5Mn + 1.0Zr + \gamma Ni]$ γ |
|---|---|
| 27 | 0 |
| 61 | 0.1 |
| 62 | 1.0 |
| 63 | 5.0 |
| 64** | 10.0 |

The mark ** is out of the scope of a preferred embodiment of the present invention

TABLE 6

| Sample No. | Logarithm of insulation resistance log (ρ/Ω · cm) | Dielectric loss tan δ (%) | Dielectric constant εr | Electromechanical coupling coefficient kp (%) | Piezoelectric constant $d_{33}$ (pC/N) | Curie point Tc (° C.) |
|---|---|---|---|---|---|---|
| 27 | 11.3 | 6.1 | 1380 | 25.3 | 102 | 260 |
| 61 | 10.5 | 4.0 | 1140 | 35.0 | 171 | 260 |
| 62 | 10.0 | 3.0 | 1090 | 37.6 | 180 | 260 |
| 63 | 9.8 | 3.2 | 1085 | 36.3 | 174 | 260 |
| 64* | 8.5 | — | — | — | — | — |

The mark ** is out of the scope of a preferred embodiment of the present invention In Sample Nos. 61 to 63, since 0.1 to 5.0 mol of Ni is contained, relative to 100 mol of the main ingredient, and very excellent piezoelectric characteristics as an electromechanical coupling coefficient kp of 35.0 to 37.6%, and a piezoelectric constant $d_{33}$ of 171 to 180 pC/N were obtained. In other words, it was found that in comparison with Sample No. 27 not containing Ni, the electromechanical coupling coefficient kp and the piezoelectric constant $d_{33}$ are dramatically improved although the dielectric constant εr tends to slightly decrease.

On the other hand, the logarithm of an insulation resistance $\log(\rho/\Omega\cdot cm)$ was as low as 8.5 for Sample No. 64, and polarization was not allowed, and characteristics could not be measured. It is believed that since the content molar amount γ of Ni is as large as 10 mol, relative to 100 mol of the main ingredient, Ni that is unable to be solid-solved in the main ingredient arises, and the excess Ni deposits as metal at a grain boundary or crystalline triple point to result in decrease in the insulation resistance.

EXAMPLE 4

In Example 4, samples having various contents of the specific rare earth element M3 relative to the main ingredient, and samples containing different kinds of the specific rare earth element M3 were prepared, and their characteristics were evaluated.

First, as a ceramic base material, $K_2CO_3$, $Na_2CO_3$, $Li_2CO_3$, $Nb_2O_5$, $CaCO_3$, $ZrO_2$, MnO, $Yb_2O_3$, $Sc_2O_3$, $In_2O_3$, $Y_2O_3$, $Nd_2O_3$, $Eu_2O_3$, $Gd_2O_3$, $Dy_2O_3$, $Sm_2O_3$, $Ho_2O_3$, $Er_2O_3$, $Tb_2O_3$, $Lu_2O_3$, $La_2O_3$ and $Pr_2O_3$ were prepared. Then weighing was conducted to achieve compositions having δ and M3 as shown in Table 7 in the general formula $[100\{0.96(K_{0.44}Na_{0.54}Li_{0.02})NbO_3-0.04CaZrO_3\}+5Mn+3.0Zr+\delta M3]$.

Then samples of Sample Nos. 71 to 89 were prepared in a similar manner and procedure as in Example 1.

Next, for each sample of Sample Nos. 71 to 89, the logarithm of an insulation resistance $\log(\rho/\Omega\cdot cm)$ was measured by using a DC voltmeter, and then an electric field of 3.0 kV/mm was applied for 30 minutes in insulating oil at 80° C. to effect a polarization treatment.

Next, for each sample, dielectric loss tan δ, dielectric constant εr, electromechanical coupling coefficient kp of radial oscillation, piezoelectric constant $d_{33}$ and Curie point Tc were measured in a similar manner as in Example 1.

Particles on a surface of a sintered body were observed under a scanning electron microscope (SEM), and 10 observation points were arbitrarily extracted, and a mean particle size was calculated.

Further, an electric field varying with 0.5 kV/mm increments was applied for 30 minutes, and the breakdown electric field where the sample broke was determined.

Table 7 shows ingredient compositions of Sample Nos. 71 to 89, and Table 8 shows measuring results of these samples.

TABLE 7

| Sample No. | $100 [0.96 (K_{0.44}Na_{0.54}Li_{0.02})(NbO_3 - 0.04CaZrO_3) + 5Mn + 3.0Zr + \delta M3]$ δ | M3 |
|---|---|---|
| 71 | 0.1 | Yb |
| 72 | 1.0 | Yb |
| 73 | 5.0 | Yb |
| 74*** | 10.0 | Yb |
| 75 | 0.5 | Sc |

TABLE 7-continued

| Sample No. | 100 [0.96 ($K_{0.44}Na_{0.54}Li_{0.02}$)($NbO_3$ − 0.04$CaZrO_3$) + 5Mn + 3.0Zr + δM3] | |
|---|---|---|
| | δ | M3 |
| 76 | 0.5 | In |
| 77 | 0.5 | Y |
| 78 | 0.5 | Nd |
| 79 | 0.5 | Eu |
| 80 | 0.5 | Gd |
| 81 | 0.5 | Dy |
| 82 | 0.5 | Sm |
| 83 | 0.5 | Ho |
| 84 | 0.5 | Er |
| 85 | 0.5 | Tb |
| 86 | 0.5 | Lu |
| 87 | 0.5 | La |
| 88 | 0.5 | Pr |
| 89 | 0 | — |

The mark *** is out of the scope of a preferred embodiment of the present invention

TABLE 8

| Sample No. | Logarithm of insulation resistance log (ρ/Ω·cm) | Dielectric loss tan δ (%) | Dielectric constant εr | Electromechanical coupling coefficient kp (%) | Piezoelectric constant $d_{33}$ (pC/N) | Curie point Tc (° C.) | Mean particle size of sintered body (μm) | Breakdown electric field (kV/mm) |
|---|---|---|---|---|---|---|---|---|
| 71 | 11.0 | 5.5 | 1330 | 20.1 | 103 | 280 | 1.5 | 8.0 |
| 72 | 11.5 | 4.8 | 1320 | 20.3 | 101 | 280 | 0.5 | 8.5 |
| 73 | 12.1 | 3.2 | 1160 | 21.1 | 105 | 280 | 0.5 | 8.0 |
| 74*** | 7.1 | — | — | — | — | — | 0.3 | — |
| 75 | 11.2 | 5.1 | 1320 | 30.1 | 131 | 280 | 0.7 | 8.5 |
| 76 | 10.2 | 7.8 | 1350 | 25.7 | 124 | 280 | 0.6 | 8.0 |
| 77 | 10.1 | 8.9 | 1390 | 28.1 | 129 | 250 | 0.7 | 8.0 |
| 78 | 10.1 | 9.2 | 1360 | 24.3 | 107 | 260 | 0.5 | 7.0 |
| 79 | 10.5 | 6.7 | 1360 | 26.1 | 115 | 260 | 0.5 | 7.0 |
| 80 | 10.7 | 6.7 | 1270 | 25.9 | 113 | 270 | 0.6 | 7.5 |
| 81 | 10.7 | 6.4 | 1410 | 27.7 | 129 | 260 | 0.6 | 7.5 |
| 82 | 11.0 | 6.1 | 1360 | 30.6 | 135 | 260 | 0.5 | 8.5 |
| 83 | 11.2 | 5.8 | 1290 | 28.8 | 133 | 260 | 0.7 | 7.0 |
| 84 | 11.2 | 5.6 | 1390 | 29.8 | 138 | 260 | 0.5 | 8.0 |
| 85 | 11.1 | 6.2 | 1300 | 24.3 | 104 | 260 | 0.6 | 7.0 |
| 86 | 11.1 | 6.4 | 1320 | 28.5 | 130 | 260 | 0.7 | 8.5 |
| 87 | 10.2 | 7.1 | 1620 | 20.0 | 102 | 200 | 1.5 | 6.0 |
| 88 | 11.0 | 6.4 | 1270 | 24.4 | 110 | 260 | 0.7 | 7.0 |
| 89 | 11.0 | 6.2 | 1310 | 16.9 | 85 | 280 | 3.0 | 4.0 |

The mark *** is out of the scope of a preferred embodiment of the present invention It was found that such piezoelectric characteristics for Sample Nos. 71 to 73 as an electromechanical coupling coefficient kp of 20% or higher, and a piezoelectric constant $d_{33}$ of 100 pC/N or higher are achieved, and a Curie point of 280° C. is obtained because the content molar amount γ of Yb is 0.1 to 5.0, relative to 100 mol of the main ingredient.

Sample Nos. 75 to 88 are samples containing a specific rare earth element M3 of the present invention other than Yb in an amount of 0.5 mol, relative to 100 mol of the main ingredient. It was found that such excellent piezoelectric characteristics as an electromechanical coupling coefficient kp of 20.0 to 30.6%, and a piezoelectric constant $d_{33}$ of 102 to 138 pC/N, and such a high Curie point Tc as 200 to 280° C. are obtained.

On the other hand, since the content molar amount γ of Yb which is the specific rare earth element M3 in Sample No. 74 is 10 mol relative to 100 mol of the main ingredient which is too large to allow sufficient sintering, the logarithm of an insulation resistance log(ρ/Ω·cm) was 7.1 and a polarization defect was caused.

From the foregoing description, it was demonstrated that although the specific rare earth element M3 may be contained in the piezoelectric porcelain composition as needed, the content molar amount γ of the same is preferably 0.1 to 5.0 mol, relative to 100 mol of the main ingredient.

While Sample No. 89 not containing the specific rare earth element M3 has an electromechanical coupling coefficient kp of 16.9%, and a piezoelectric constant $d_{33}$ of 85 pC/N, which are durable to practical use, these were inferior to those in Sample Nos. 71 to 73, and 75 to 88 containing 0.1 to 5.0 mol of the specific rare earth element M3, relative to 100 mol of the main ingredient.

That is, it was demonstrated that by containing 0.1 to 5.0 mol of the specific rare earth element M3 relative to 100 mol of the main ingredient, piezoelectric characteristics are dramatically increased compared to a case where the specific rare earth element M3 is not contained.

In contrast to Sample No. 89 showing a breakdown electric field of as low as 4.0 kV, Sample Nos. 71 to 73, and 75 to 88 showed such a large breakdown electric field as 6.0 to 8.5 kV/mm, demonstrating better availability at a higher electric field in comparison with Sample No. 89. In other words, it is believed that the specific rare earth element M3 has an effect of reducing mean particle size of the sintered body, and by such reduction in mean particle size, the intensity of the piezoelectric porcelain composition increases, and as a result the breakdown electric field increases. It was found that this makes it possible to further thin the ceramic layer, and the thinning allows obtainment of a piezoelectric ceramic electronic component having a larger displacement.

It was found that in Sample No. 87 using La as the specific rare earth element M3, while excellent piezoelectric characteristics were obtained in comparison with Sample No. 89 not containing the specific rare earth element M3, the electromechanical coupling coefficient kp and the piezoelectric constant $d_{33}$ were lower than those in other Sample Nos. 73, 75 to 86 and 88 containing the specific rare earth element M3 and the Curie point Tc of was as low as 200° C. This is attributable to a fact that La is solid-solved in the K-containing site of the main ingredient.

EXAMPLE 5

Laminated piezoelectric elements were manufactured using piezoelectric porcelain compositions of Sample Nos. 1 to 3, and their characteristics were evaluated.

First, a 120 μm thick ceramic green sheet was manufactured in a similar method and procedure to those in Example 1.

Next, a conductive paste for internal electrode using Ni as a conductive material was prepared. Then, using this conductive paste for internal electrode, a conductive layer of a predetermined pattern was formed on the ceramic green sheet by a screen printing method. Then the ceramic green sheets on which a conductive film is formed were laminated, and the laminate was sandwiched top and bottom by ceramic green sheets on which a conductive layer is not formed, and crimped by pressuring at a pressure of about $2.45 \times 10^7$ Pa, to form a ceramic laminate.

Then, the ceramic laminate was sintered for two hours at a temperature of 1000 to 1160° C. in a reductive atmosphere which is adjusted to be reductive side by 0.5 of Ni/NiO equilibrium oxygen partial pressure, to obtain a ceramic base (ceramic sintered body).

Then on the ceramic base, an external electrode having a double-layered structure of a Ni—Cu alloy and Ag was formed by sputtering, to obtain samples of Sample Nos. 71 and 72.

For each sample of Sample Nos. 91 and 92, the logarithm of an insulation resistance log(ρ/Ω·cm) was measured using a DC voltmeter.

Also, an electric field of 3.0 kV/mm was applied for 30 minutes in insulating oil at 80° C. to effect a polarization treatment. Thereafter, a laminated piezoelectric element was obtained by cutting into a rectangular shape of 15 mm long, 3 mm wide and 0.7 mm thick so that the external electrode is positioned on an end face.

Next, for each sample, dielectric loss tan δ, dielectric constant εr, electromechanical coupling coefficient kp of longitudinal oscillation, and Curie point Tc were measured in a similar manner as in Example 1.

Also, an electric field of 2.0 kV/mm was applied on each sample, and a piezoelectric constant at the time of application of a high-electric field $d_{33}$ (hereinafter, also referred to as "piezoelectric constant at high-electric field") was measured. That is, an electric field of 2.0 kV/mm was applied on each sample, displacement of the sample was measured by a displacement meter, distortion was determined by dividing the displacement by a sample thickness, and the distortion was further divided by electric field, to thereby determine a piezoelectric constant at the high-electric field $d_{33}$.

Table 9 shows measurement results of Sample Nos. 91 and 92.

As is apparent from Table 9, since the piezoelectric porcelain composition in Sample No. 92 departing from the range of the present invention is used, an excellent sintered body was not obtained at a temperature ranging from 1000 to 1160° C., and the logarithm of n insulation resistance log(ρ/Ω·cm) was as low as 5.3 even at the sintering temperature 1160° C., at which it was maximum, and a polarization defect was caused.

In contrast to this, since the piezoelectric porcelain composition of the present is used in Sample No. 91, the logarithm of an insulation resistance log(ρ/Ω·cm) was 12.0, dielectric loss tan δ was 4.24%, and it was found that sintering is sufficiently effected even when it is co-sintered with a conductive layer mainly including Ni in a reductive atmosphere, and stable polarization treatment can be achieved. Also, it was found that such excellent piezoelectric characteristics as a piezoelectric constant at the high-electric field $d_{33}$ of 240 pC/33N are obtained.

The invention claimed is:

1. A piezoelectric porcelain composition comprising $$100\{(1-x)(K_{1-a-b}Na_aLi_b)(Nb_{1-c}Ta_c)O_3-xM2M4O_3\}+\alpha Mn+\beta M4$$

wherein the main ingredient is represented by the general formula $$((1-x)(K_{1-a-b}Na_aLi_b)(Nb_{1-c}Ta_c)O_3-xM2M4O_3)$$

in which M2 is at least one member selected from the group consisting of Ca, Ba and Sr, M4 is at least one member selected from the group consisting of Zr, Sn and Hf, $0.005 \leq x \leq 0.1$, $0 \leq a \leq 0.9$, $0 \leq b \leq 0.1$, $0 \leq a+b \leq 0.9$, and $0 \leq c \leq 0.3$, the amount α of Mn ranges from 2 to 15 mols, relative to 100 mol of the main ingredient, and the amount β of M4 ranges from 0.1 to 5.0 mols, relative to 100 mol of the main ingredient, said piezoelectric porcelain composition has the property of being co-sinterable with Ni electrodes in a reducing atmosphere.

2. The piezoelectric porcelain composition according to claim 1, further comprising Ni in an amount ranging from 0.1 to 5.0 mols, relative to 100 mol of the main ingredient.

TABLE 9

| Sample No. | Composition | Sintering temperature (° C.) | Logarithm of insulation resistance log (ρ/Ω · cm) | Dielectric loss tan δ (%) | Dielectric constant εr | Electromechanical coupling coefficient kp (%) | Piezoelectric constant at high-electric field $d_{33}$ (pC/N) | Curie point Tc (° C.) |
|---|---|---|---|---|---|---|---|---|
| 91 | Same as sample no. 1 | 1080 | 120 | 4.24 | 1380 | 14.5 | 240 | 180 |
| 92* | Same as sample no. 3 | 1160 | 5.3 | — | — | — | — | — |

The mark * is out of the scope of the present invention

In Table 9, the temperature at which a piezoelectric constant $d_{33}$ is maximum is determined as sintering temperature in Sample No. 91. Also, the temperature at which a logarithm of an insulation resistance log(ρ/Ω·cm) is maximum is determined as sintering temperature in Sample No. 92.

3. The piezoelectric porcelain composition according to claim 2, further comprising at least one element selected from the group consisting of Sc, In, Yb, Y, Nd, Eu, Gd, Dy, Sm, Ho, Er, Tb, Lu, La, and Pr in an amount ranging from 0.1 to 5.0 mols, relative to 100 mol of the main ingredient.

4. The piezoelectric porcelain composition according to claim 3, wherein the amount α of Mn ranges from 5 to 10 mols relative to 100 mol of the main ingredient.

5. The piezoelectric porcelain composition according to claim 4, wherein the amount β of M4 ranges from 1 to 5 mols relative to 100 mol of the main ingredient.

6. The piezoelectric porcelain composition according to claim 1, further comprising at least one element selected from the group consisting of Sc, In, Yb, Y, Nd, Eu, Gd, Dy, Sm, Ho, Er, Tb, Lu, La, and Pr in an amount ranging from 0.1 to 5.0 mols, relative to 100 mol of the main ingredient.

7. The piezoelectric porcelain composition according to claim 6, wherein the amount α of Mn ranges from 5 to 10 mols relative to 100 mol of the main ingredient.

8. The piezoelectric porcelain composition according to claim 7, wherein the amount β of M4 ranges from 1 to 5 mols relative to 100 mol of the main ingredient.

9. The piezoelectric porcelain composition according to claim 1, wherein the amount α of Mn ranges from 5 to 10 mols relative to 100 mol of the main ingredient.

10. The piezoelectric porcelain composition according to claim 1, wherein the amount β of M4 ranges from 1 to 5 mols relative to 100 mol of the main ingredient.

11. A piezoelectric ceramic electronic component having an external electrode on a surface of a piezoelectric ceramic base, wherein the piezoelectric ceramic base is a piezoelectric porcelain composition according to claim 1.

12. The piezoelectric ceramic electronic component according to claim 11 in which the piezoelectric ceramic base is a sintered stack of alternating internal electrode and piezoelectric ceramic composition layer.

13. The piezoelectric ceramic electronic component according to claim 12, wherein the internal electrode comprises Ni.

14. A piezoelectric ceramic electronic component having an external electrode on a surface of a piezoelectric ceramic base, wherein the piezoelectric ceramic base is a piezoelectric porcelain composition according to claim 2.

15. The piezoelectric ceramic electronic component according to claim 14 in which the piezoelectric ceramic base is a sintered stack of alternating internal electrode and piezoelectric ceramic composition layer.

16. The piezoelectric ceramic electronic component according to claim 15, wherein the internal electrode comprises Ni.

17. A piezoelectric ceramic electronic component having an external electrode on a surface of a piezoelectric ceramic base, wherein the piezoelectric ceramic base is a piezoelectric porcelain composition according to claim 3.

18. The piezoelectric ceramic electronic component according to claim 17 in which the piezoelectric ceramic base is a sintered stack of alternating internal electrode and piezoelectric ceramic composition layer.

19. The piezoelectric ceramic electronic component according to claim 18, wherein the internal electrode comprises Ni.

20. A piezoelectric ceramic electronic component having an external electrode on a surface of a piezoelectric ceramic base, wherein the piezoelectric ceramic base is a piezoelectric porcelain composition according to claim 6.

21. A piezoelectric ceramic electronic component comprising a reducing atmosphere co-sintered combination of piezoelectric ceramic and at least one Ni electrode, wherein the piezoelectric ceramic is a piezoelectric porcelain composition according to claim 1.

22. A method of forming a piezoelectric ceramic electronic component comprising sintering in a reductive atmosphere a stack comprising a Ni electrode sandwiched between a pair of layers of piezoelectric porcelain composition according to claim 1.

* * * * *